(12) United States Patent (10) Patent No.: US 7,719,331 B2
Kobayashi (45) Date of Patent: May 18, 2010

(54) PLL CIRCUIT

(75) Inventor: Shotaro Kobayashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 1199 days.

(21) Appl. No.: 11/290,394

(22) Filed: Dec. 1, 2005

(65) Prior Publication Data

US 2006/0119405 A1 Jun. 8, 2006

(30) Foreign Application Priority Data

Dec. 2, 2004 (JP) ............................. 2004-350103

(51) Int. Cl.
*H03L 7/08* (2006.01)
*H03L 7/087* (2006.01)
(52) U.S. Cl. ........................... 327/158; 327/43; 327/49; 327/236; 331/1 R; 331/DIG. 2
(58) Field of Classification Search ........................ None
See application file for complete search history.

(56) References Cited

U.S. PATENT DOCUMENTS

| | | | |
|---|---|---|---|
| 5,896,066 A * | 4/1999 | Katayama et al. ............. | 331/17 |
| 6,049,233 A | 4/2000 | Shurboff | |
| 6,320,435 B1 | 11/2001 | Tanimoto | |
| 6,430,244 B1 * | 8/2002 | Ryu ........................... | 375/376 |
| 6,542,038 B2 | 4/2003 | Nishimura et al. | |
| 6,774,679 B2 * | 8/2004 | Nogami ........................ | 327/3 |
| 6,946,887 B2 * | 9/2005 | Ho ............................. | 327/156 |
| 7,042,970 B1 * | 5/2006 | Keaveney et al. ............ | 375/371 |
| 7,061,290 B2 * | 6/2006 | Hasegawa .................... | 327/157 |

(Continued)

FOREIGN PATENT DOCUMENTS

JP 10-190457 A 7/1998

(Continued)

OTHER PUBLICATIONS

Bahzad Razavi, translated by Tadahiro Kuroda, "Designing of Analog CMOS Integrated Circuits, Application," Mar. 30, 2003, pp. 667-691.

*Primary Examiner*—Lincoln Donovan
*Assistant Examiner*—Terry L Englund
(74) *Attorney, Agent, or Firm*—Sughrue Mion, PLLC

(57) ABSTRACT

Disclosed is a PLL circuit including a phase frequency detector (PFD) for comparing phase and frequency between an input signal and an output signal, a charge pump circuit for charging a capacitor when an up-signal from the PFD is activated, discharging the capacitor when a down-signal is activated, and for outputting the terminal voltage of the capacitor as a control voltage, and a VCO for outputting an output signal of a frequency in accordance with the control voltage. An output of the VCO is fed back as an output signal to the PFD as input. The PFD includes a delay adjustment circuit for exercising control for resetting the up-signal and the down-signal with a preset delay as from a time point both up-signal and the down-signal have been activated. There is also provided a comparator amplifier circuit for comparing a reference voltage, corresponding to a control voltage when both up-signal and down-signal are activated, to supply first and second control signals to the delay adjustment circuit. The pulse widths of up and down-signals are adjusted depending on current offset characteristics of the charge pump circuit.

11 Claims, 12 Drawing Sheets

U.S. PATENT DOCUMENTS 7,092,475 B1 * 8/2006 Huard .................... 375/375

FOREIGN PATENT DOCUMENTS

| | | |
|---|---|---|
| JP | 11-205133 A | 7/1999 |
| JP | 11-298261 A | 10/1999 |
| JP | 11-330958 A | 11/1999 |
| JP | 2000-349626 A | 12/2000 |
| JP | 2001-119296 A | 4/2001 |
| JP | 2002-141798 A | 5/2002 |
| JP | 2002-232290 A | 8/2002 |
| JP | 2003-87115 A | 3/2003 |
| JP | 3425909 B2 | 9/2003 |
| JP | 2004-64742 A | 2/2004 |
| JP | 2005-123944 A | 5/2005 |

* cited by examiner

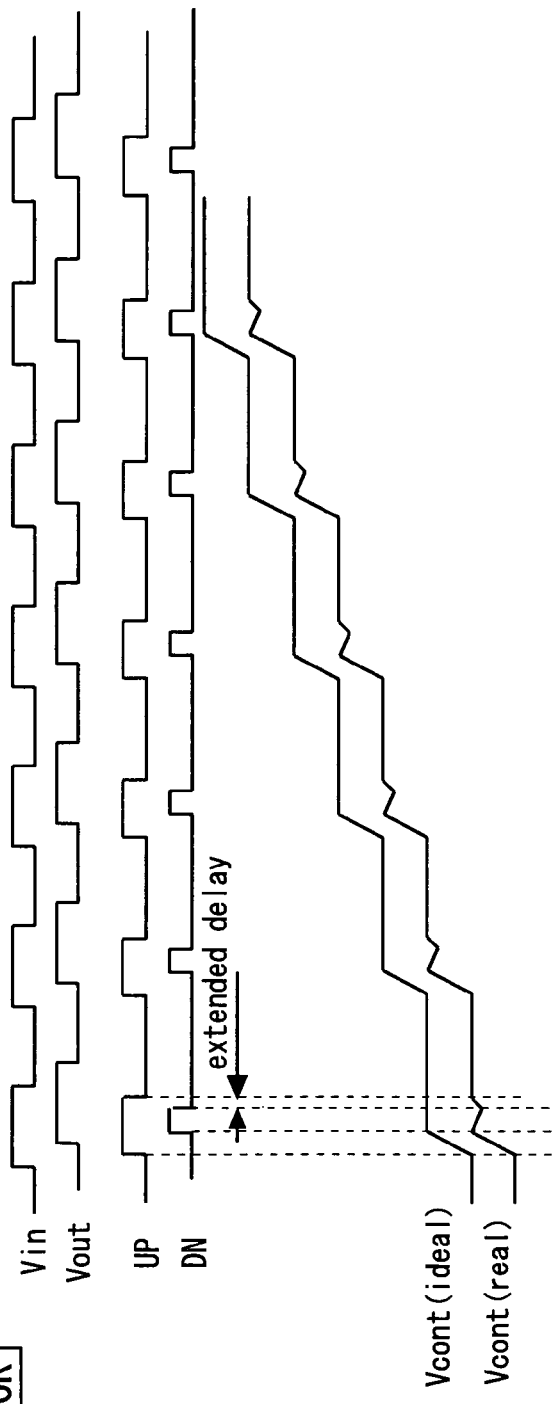
FIG. 2A BEFORE LOCK
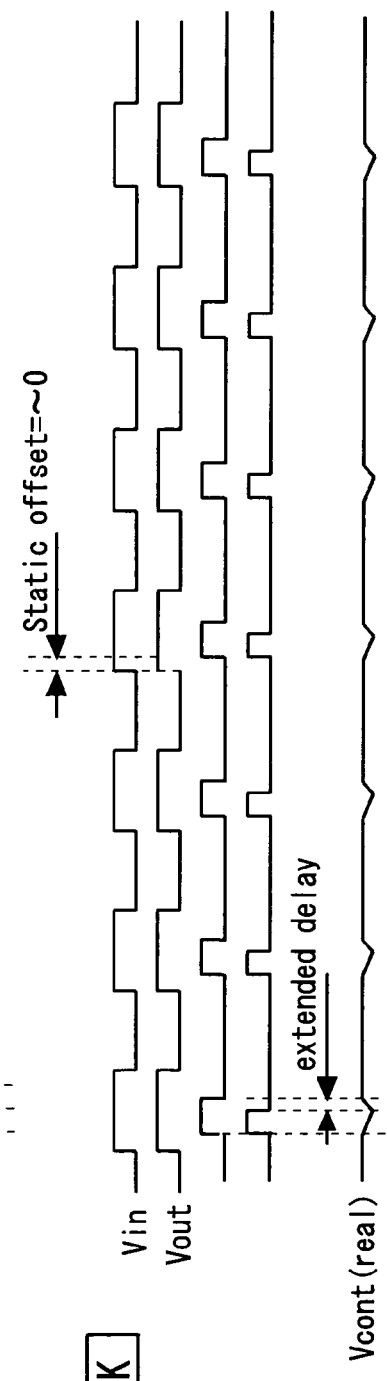
FIG. 2B AFTER LOCK

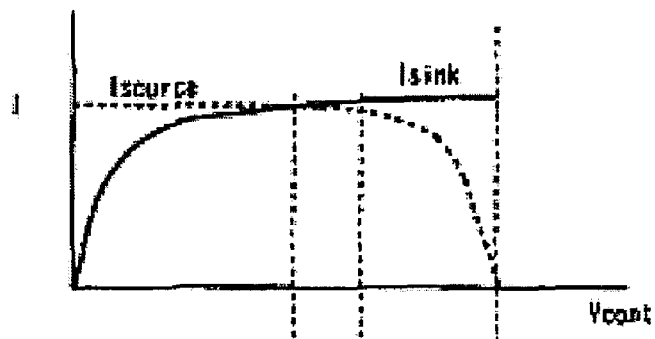
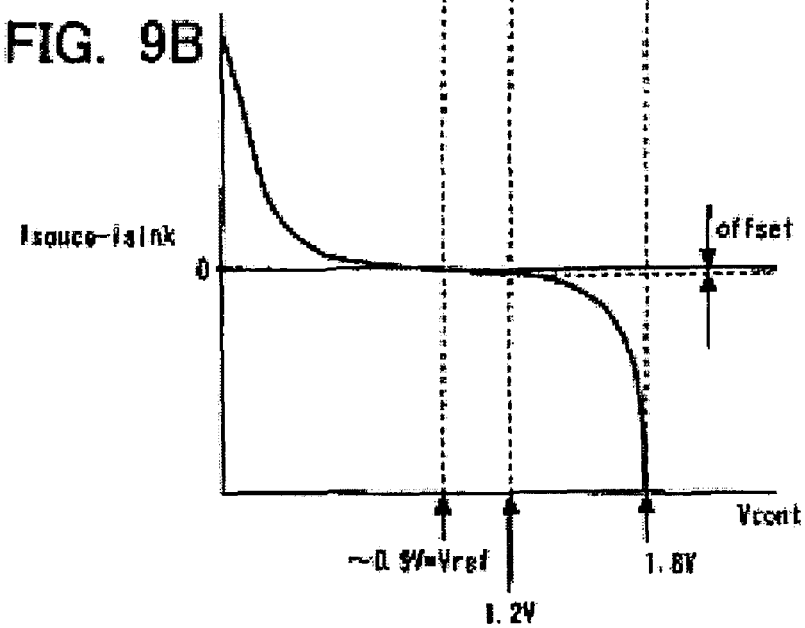

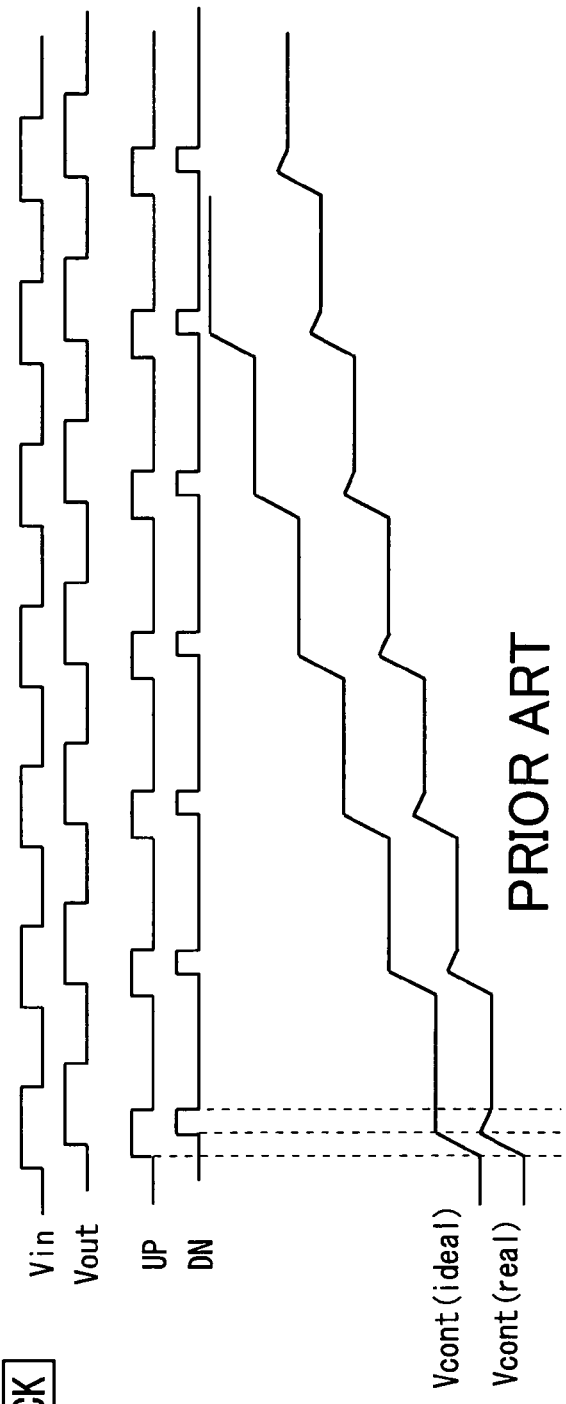
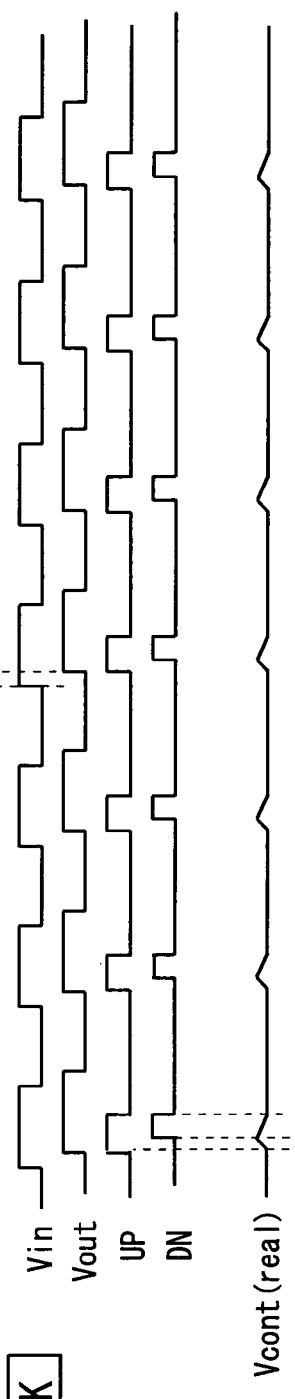
FIG. 11A BEFORE LOCK PRIOR ART
FIG. 11B AFTER LOCK PRIOR ART

PLL CIRCUIT

FIELD OF THE INVENTION

This invention relates to a PLL circuit and, more particularly, to a circuit configuration that may be suitably applied to a charge-pump type PLL circuit.

BACKGROUND OF THE INVENTION

Recently, with the increase of operating speed (operating clock frequency) of CMOS LSI products, larger numbers of LSI products, each having a PLL (phase-locked loop) circuit, are manufactured and sold. The degree of accuracy demanded of the PLL circuit nowadays has become increasingly higher.

In the conventional charge-pump type PLL circuit, phase offset persists, so that variations in for example, temperature, power supply voltage, or fabrication process, significantly affect the circuit characteristic of the PLL circuit. Hence, the improvement of this situation in the charge-pump type PLL circuit is required.

FIG. 10 is a diagram illustrating an example of the configuration of a conventional charge-pump type PLL circuit (see Non-Patent Document 1). Referring to FIG. 10, the conventional charge-pump type PLL circuit includes a phase frequency detector (PFD) 10', a charge pump circuit 20, and a voltage-controlled oscillator (VCO) 30. An output Vout of the VCO 30 is fed back as an input to the phase frequency detector 10'. The phase frequency detector (PFD) 10' compares the phase of an output signal Vout with that of an input signal Vin, and outputs an UP signal UP, its complementary signal UPb, a DOWN signal DN and its complementary signal DNb. Of these, the signals UPb and DN are supplied to the charge pump circuit 20. The phase frequency detector (PFD) 10' includes a D-type flip-flop with reset 11, a D-type flip-flop with reset 12, and AND circuit 13. The D-type flip-flop 11 has a data input terminal D connected to a power supply VDD, has a clock input terminal CK supplied with Vin, and samples a signal (HIGH LEVEL) at the data input terminal D responsive to the rising edge of Vin to output UP at a high level and UPb at a low level from a non-inverting output terminal Q and from an inverting output terminal QB, respectively. The D-type flip-flop 12 has a data input terminal D connected to the power supply VDD, has a clock input terminal CK supplied with Vout, and samples a signal at the data input terminal D responsive to the rising edge of Vout to output DN at a high level and DNb at a low level from the non-inverting output terminal Q and at the inverting output terminal QB, respectively. The AND circuit 13 receives UP and DN as inputs. An output signal (reset) of the AND circuit 13 is supplied to reset terminals R of the D-type flip-flops 11 and 12. When UP and DN are high, the output signal (reset) from the AND circuit 13 becomes high and the D-type flip-flops 11 and 12, which receive the high level reset signal from the AND circuit 13 at respective reset terminals R, are reset, as a result of which outputs UP and DN are reset to a low level, while respective complementary signals UPb and DNb are reset to a high level.

The charge pump circuit 20 includes pMOS transistors Pa1 and Pa2, nMOS transistors Na1 and Na2, and a capacitor 21. The pMOS transistor Pa1 has a source and a gate connected to the power supply VDD and to Vb2 (bias voltage), respectively. The pMOS transistor Pa2 has a source connected to the drain of the pMOS transistor Pa1 and has a gate supplied with Upb. The nMOS transistor Na2 has a drain connected to the drain of the pMOS transistor Pa2 and has a gate supplied with DN. The nMOS transistor Na1 has a drain connected to the source of the nMOS transistor Na2, has a gate supplied with Vb1 and has a source connected to the ground (GND). With this charge pump circuit 20, when UP is high and UPb is low, the pMOS transistor Pa2 is turned on to charge the capacitor 21 by the source current Isource supplied from the pMOS transistor Pa1 constituting a current source. Conversely, when DN is high, the nMOS transistor Na2 is turned on to discharge the capacitor 21 by the sink current Isink supplied from the nMOS transistor Na1 constituting a current source. The pMOS transistor Pa1 and the nMOS transistor Na1 receive at gates thereof bias voltages Vb2 and Vb1, respectively, such that the source current Isource and the sink current Isink will be as approximately equal to each other as possible. The respective timings at which the source current Isource and the sink current Isink flow are adjusted by the on time of the transistors Pa2 and Na2, which are on/off controlled by the signals UPb and DN, respectively. The terminal voltage of the capacitor 21 is supplied as the control voltage Vcont to the VCO 30.

The Patent Document 1 shows, a charge pump circuit comprising a current correcting circuit as shown in FIG. 12 is disclosed. This charge pump circuit operates as follows. When charging/discharging the capacitor in an LPF (loop filter), using UP and DN pulses output from a phase comparator, the difference between the charging current and the discharge current, resulting from the offset between output impedances of a pMOS transistor P12 and an nMOS transistor N12, is extracted and corrected so as to make the charging current and the discharge current equal to each other by a sense amplifier (AMP) 5. An output of the sense amplifier (AMP) 5 is fed back to pMOS transistors P12 and P14 to render the control voltage Vcont constant or to make Vcont to be kept in a preset voltage width. P13 and P11 are pMOS transistors, N11 and N13-N16 are nMOS transistors and I11 is a current source.

The Patent Document 2 discloses a PLL circuit including a pulse adjustment unit between a phase comparator and a charge pump and a pulse width adjustment unit for controlling the pulse width of UP and DOWN pulse signals output from the phase comparator to the charge pump to enable the lock in time to be reduced.

The Patent Document 3 discloses a PLL circuit including a feedback loop, comprised of a phase comparator for comparing the phase of a reference clock with that of a feedback clock, a charge pump, a loop filter and an oscillator, a pulse generator supplied with the reference clock and the feedback clock, and a pulse width decision circuit, and configured for adjusting the amount of phase correction consistent with the ratio of the delay in the feedback loop and the interval of the phase comparision.

The Patent Document 4 discloses a PLL circuit in which a reset signal of a phase comparator is delayed for decreasing a phase insensitive zone in a phase comparator.

The Patent Document 5 discloses the configuration of a PLL circuit in which two current source circuits are provided in a circuit for generating the current or the voltage consistent with the phase difference detected by a phase comparator, the operating current in the circuit is increased to cause a high gain operation of the circuit in effecting frequency pull-in, and in which the operating current in the circuit is decreased to cause high gain operation of the circuit in effecting phase matching.

The Patent Document 6 discloses, as the configuration for preventing a PLL circuit from being locked with a phase shift being remained, the configuration of a charge pump including a PNP transistor for current setting, an NPN transistor for current adjustment, and a feedback amplifier, in which no offset current flows through a filter even in case the output terminal voltage is varied, such as to maintain the balance of the charging current and the discharge current for a filter.

The Patent Document 7 is a diagram illustrating the configuration in which there are provided a steady-state phase error detection unit for detecting the phase difference between a reference clock and a VCO output clock signal, means for outputting a control signal for detecting the steady-state phase error only when the PLL circuit is in a pull-in state to control a steady-state phase error detection unit, and a load circuit means for adding a load to a reference clock line and to a feedback line from the VCO responsive to the steady-state phase error.

[Non-Patent Document 1]
Bahzad Razavi, translated by Tadahiro Kuroda, 'Designing of Analog CMOS Integrated Circuits, Application', published by MARUZEN, Mar. 30, 2003, pages 667-691

[Patent Document 1]
Japanese Patent Kokai Publication No. JP-P2003-87115A

[Patent Document 2]
Japanese Patent Kokai Publication No. JP-P2000-349626A

[Patent Document 3]
Japanese Patent Kokai Publication No. JP-P2002-141798A

[Patent Document 4]
Japanese Patent Kokai Publication No. JP-P2004-64742A

[Patent Document 5]
Japanese Patent Kokai Publication No. JP-A-11-205133

[Patent Document 6]
Japanese Patent Kokai Publication No. JP-A-11-298261

[Patent Document 7]
Japanese Patent No. 3425909

SUMMARY OF THE DISCLOSURE

In the charge pump circuit 20, phase offset is produced, because the offset in the current value necessarily persists due to physical properties of transistors constituting the charge pump the circuit, except for a specified output potential. FIGS. 11A, and 11B are timing diagrams, illustrating timing wavefroms of Vin, Vout, UP, DN and a control voltage Vcont (theoretical and actual voltage waveforms) which is a terminal voltage of the capacitor 21, before and after lock, respectively, in case there persists the current offset in the charge pump circuit 20 of FIG. 10. By 'lock' is meant a stable state in which Vin and Vout exhibit frequency coincidence, with there being no phase change. Although complete freeness from the phase difference is ideally desirable, there actually persists phase offset to a more or less extent. FIG. 11A illustrates a state in which Vin and Vout are approximately coincident in frequency but are not completely coincident in phase with each other and are still changing. Since Vin is operating slightly ahead of Vout, the pulse width of the set side of UP is broader. When only UP is high, the capacitor 21 is charged by the source current Isource, and hence the control voltage Vcont rises monotonously.

When both UP and DN are high, charging and discharging of the capacitor 21 are carried out by the Isource current and the Isink current, with inherently equal current value, and hence the level of the voltage Vcont is ideally unchanged. This state is shown as Vcont (ideal). However, in actuality, when UP and DN are both high, the voltage Vcont falls, due for example to the presence of the current offset, such as the current Isource being slightly smaller than the current Isink. This state is shown by Vcont (real).

If there is such current offset, the state after lock is the state of lock under the proviso that static phase offset shown in FIG. 11B has been produced at the time of rising of Vin and Vout.

If a DC (direct current) based correction means, employing a replica charge pump, is to be provided in the PLL circuit in order to reduce the current offset of the charge pump circuit, there is presented such a problem that, under the effect of the rise time of an output signal of a phase frequency detection circuit or due to use of a lower voltage value of the power supply, adjustment width limitations tend to be stringent, while the adjustable range of the offset tends to be reduced.

As mentioned above, it is desirable in the PLL circuit to reduce the phase offset, caused by the charge pump circuit.

A PLL circuit according to the present invention includes a means for adjusting the pulse width of a phase frequency detector (also abbreviated to 'PFD'), in which the pulse width of the PFD is adjusted depending on an offset characteristic of the charge pump circuit, thereby reducing the phase offset ascribable to the charge pump circuit.

A PLL circuit in accordance with one aspect of the present invention comprises: a phase frequency detector for comparing phase and frequency between an input signal and a feedback output signal and outputting a comparison result output signal indicative of the result of comparison;

a charge pump circuit for receiving the comparison result output signal from said phase frequency detector and generating a control voltage in accordance with the result of comparison in said phase frequency detector; and a voltage-controlled oscillator for receiving the control voltage and generating an output signal of a frequency in accordance with the control voltage, said output signal of said voltage-controlled oscillator or a frequency-divided version of said output signal being supplied as said feedback output signal to said phase frequency detector, wherein the phase frequency detector comprises:

a first flip-flop for receiving said input signal and outputting a first signal in an active state, responsive to transition of said input signal;

a second flip-flop for receiving feedback output signal to output a second signal in an active state, responsive to transition of said feedback output signal;

a logic circuit for receiving said first and second signals and outputting a reset signal when said first and second signals are both in an active state; and a delay adjustment circuit for receiving a reset signal output from said logic circuit and supplying first and second reset signals, obtained by delaying said reset signal separately, to reset terminals of said first and second flip-flops, respectively.

Preferably, the PLL circuit according to the present invention may further comprises: a reference voltage generating circuit for generating a voltage corresponding to the control voltage generated by said charge pump circuit when said first and second signals are both in an active state, and for outputting the generated voltage as a reference voltage; and a comparator amplifier circuit for comparing a control voltage output from said charge pump circuit with said reference voltage output from said reference voltage generating circuit, and generating first and second control signals which are for variably controlling the respective delays of said first and second reset signals in said delay adjustment circuit based on the result of comparison.

The PLL circuit according to the present invention may further comprise: a second phase frequency detector for outputting a third signal which is activated when transition of said input signal is detected and outputting a fourth signal which is activated when transition of said feedback output signal is detected; and a comparator amplifier circuit for comparing said third and fourth signals, output from said second phase frequency detector, and generating first and second control signals which are for variably controlling the respective delays of said first and second reset signals in said delay adjustment circuit.

A PLL circuit in accordance with another aspect of the present invention comprises: a first phase detector for comparing phase between an input signal and a feedback output signal and outputting a phase comparison result output signal indicative of the result of comparison;

a charge pump circuit for receiving the phase comparison result output signal from said first phase detector and generating a control voltage in accordance with the result of phase comparison in said first phase detector; and a voltage-controlled oscillator for receiving the control voltage and generating an output signal of a frequency in accordance with the control voltage, said output signal of said voltage-controlled oscillator or a frequency-divided version of said output signal being supplied as said feedback output signal to said first phase detector; wherein said PLL circuit further comprises:

a circuit for generating a reference voltage corresponding to said control voltage when said phase comparison result output signal is activated and indicates that said input signal is in phase with said output signal; and a circuit for comparing said reference voltage with said control voltage of said charge pump circuit and generating a control signal based on said comparison result; wherein said first phase comparator comprises a circuit for variably controlling the delay time in resetting said phase comparison result output signal being in an active state to a non-activated state. The PLL circuit according to the present invention, may further comprises: a second phase comparator for comparing the phase between said input signal with that of said output signal; and a circuit for generating a control signal based on a phase comparison result signal output from said second phase comparator.

The meritorious effects of the present invention are summarized as follows.

According to the present invention, the pulse width of the phase frequency detection circuit is adjusted, depending on an offset characteristic of the charge pump circuit to reduce the phase offset ascribable to the charge pump circuit. The offset may be adjusted over a wide range in a manner free from DC-based limitations related to the decrease in the power supply voltage.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 2A and 2B illustrate the operation before lock and after lock of the first embodiment of the present invention, respectively.

FIGS. 9A and 9B illustrate the operation of a charge pump.

FIGS. 11A and 11B illustrate the operation before lock and after lock of the conventional PLL of FIG. 10.

PREFERRED EMBODIMENTS OF THE INVENTION

Figure 1:
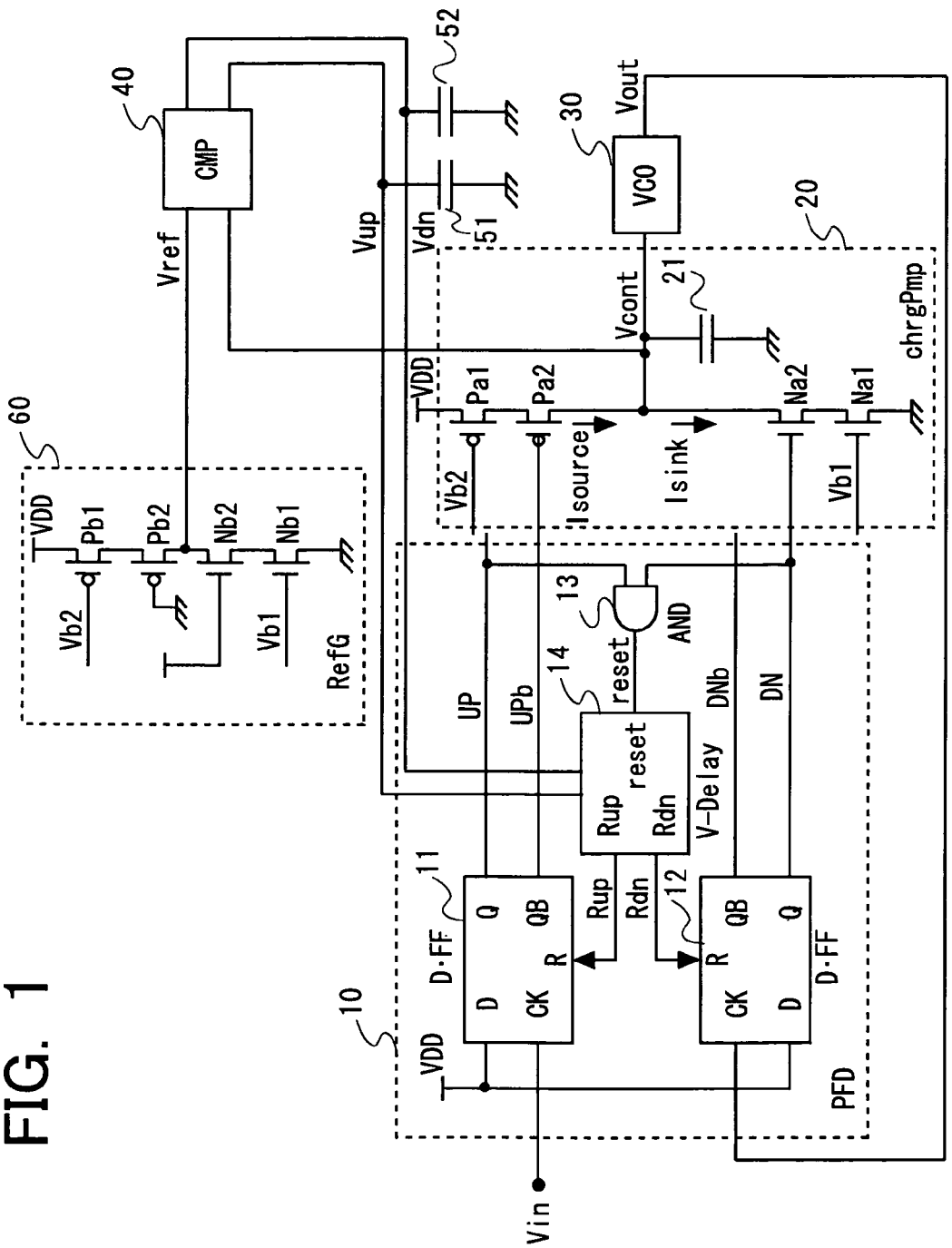
FIG. 1 is a diagram illustrating the configuration of a first embodiment of the present invention.

Referring to the drawings, certain preferred embodiments of the present invention will be described in detail. Referring to FIG. 1, the PLL circuit according to an embodiment of the present invention includes a phase frequency detector (10) for comparing phase and frequency between an input clock signal and a feedback output signal, a charge pump circuit (20) for generating a control signal corresponding to the result of comparison of the phase frequency detector, and a voltage-controlled oscillator (30) for generating an output signal of a frequency complying with the control voltage. The output signal of the voltage-controlled oscillator (30) is supplied as the feedback output signal to an input of the phase frequency detector (10). The present invention may as a matter of course adopt such a configuration in which the output signal of the voltage-controlled oscillator (30) is supplied to a frequency-divider not shown which is provided in the feedback path and the frequency-divided version of the output signal from the voltage-controlled oscillator (30) is supplied as the feedback output signal to an input of the phase frequency detector (10). The phase frequency detector (10) comprises a first flip-flop (11) supplied with the input clock signal to output a first signal in an active state, responsive to transition (one of the rising transition and the falling transition) of the input clock signal, a second flip-flop (12) supplied with the feedback output signal to output a second signal in an active state, responsive to transition of the feedback output signal, a logic circuit (13) supplied with the first and second signals to output a reset signal (reset) when the first and second signals are both in an active state, and a delay adjustment circuit (14) supplied with the reset signal output from the logic circuit (13) to supply first and second reset signals, obtained by delaying the reset signal separately, to reset terminals of the first and second flip-flops (11 and 12), respectively. As circuits for controlling the delay in the delay adjustment circuit (14), there are provided a circuit (60) for generating a voltage corresponding to a control voltage when DN and UP are activated to output the generated voltage as a reference voltage (Vref), and a comparator (40) for comparing the reference voltage (Vref) with a control voltage (Vcont) and for outputting and supplying control signals (Vup and Vdn) to the delay adjustment circuit (14) responsive to the results of comparison. The delay adjustment circuit (14) adjusts the delay time of the resetting of UP and DN based on control signals (Vup and Vdn), respectively. That is, the pulse widths of UP and DN are adjusted depending on a current offset characteristic of the charge pump circuit (20). In a modification of the PLL circuit according to the present embodiment, there may be provided, as in FIG. 3, a phase frequency detector (PFD) (10B) for comparing the phase of the input signal (Vin) with that of the output signal (Vout), and a circuit (41) for generating control signals (Vup and Vdn) of a level difference corresponding to the pulse widths of the phase comparison result signals (UP2 and DN2), output from the PFD (10B). The delay adjustment circuit (14) of the phase frequency detector (PFD) (10A) adjusts the delay time in resetting the UP and DN based on the control signals (Vup and Vdn).

The PLL circuit according to a first embodiment of the present invention will now be described in detail with reference to FIG. 1. The PLL circuit of the present embodiment is configured as a basic charge-pump type PLL circuit, as shown in FIG. 1, in which Vin and Vout stand for an input reference clock signal and an output clock signal, respectively. The PLL circuit according to the present embodiment includes, in addition to the configuration of a phase frequency detector 10' shown in FIG. 10, a delay adjustment circuit 14, as a new component. The PLL circuit according to the present embodiment is configured so that a reference voltage Vref (corresponding to the control voltage of the charge pump circuit 20 when both UP and DN are high) is compared with a control voltage Vcont supplied to the VCO 30 to output control signals Vup and Vdn for controlling the delay, in which integrated values of the signals Vup and Vdn (terminal voltages of capacitors 51 and 52) are supplied to the delay adjustment circuit 14.

A phase frequency detector (PFD) 10 compares the phase of Vout with that of Vin to output the results of comparison as an up-signal UP, its complementary signal UPb, a down-signal DN and its complementary signal DNb. In the circuit configuration, shown in FIG. 1, UPb and DN are supplied to the charge pump circuit 20.

The phase frequency detector (PFD) 10 includes a D-type flip-flop with reset 11 and a D-type flip-flop with reset 12. The D-type flip-flop with reset 11 has a data input terminal D connected to a power supply VDD (high level), has a clock input terminal CK supplied with an input signal Vin, and samples the signal at the data input terminal D responsive to the rising edge of Vin to output the signal UP at a high level and the signal UPb at a low level. The D-type flip-flop with reset 12 has a data input terminal D connected to the power supply VDD, has a clock input terminal CK supplied with an output feedback signal Vout, samples the signal at the data input terminal D responsive to the rising edge of Vout to output the signal DN in the high level and the signal DNb in the low level at the non-inverting terminal Q and at the inverting terminal QB, respectively. The phase frequency detector (PFD) 10 also includes an AND circuit 13 which receives UP and DN as inputs, and the delay adjustment circuit 14 (V-Delay), which receives an output signal (reset) of the AND circuit 13, and outputs reset signals Rup and Rdn. These reset signals Rup and Rdn, each delay of which has been adjusted by the delay adjustment circuit 14, are supplied to reset terminals R of the D-type flip-flops 11 and 12, respectively.

The charge pump circuit 20 includes PMOS transistors Pa1 and Pa2 and NMOS transistors Na1 and Na2. The PMOS transistors Pa1 has a source and a gate connected to the power supply VDD and to Vb2, respectively. The PMOS transistor Pa2, has a source connected to the drain of the PMOS transistor Pa1 and has a gate supplied with Upb. The NMOS transistor Na2 has a drain connected to the drain of the PMOS transistor Pa2 and has a gate supplied with DN. The NMOS transistor Na1 has a drain connected to the source of the NMOS transistor Na2, has a gate supplied with Vb1 and has a source grounded. The PMOS transistor Pa1 and the NMOS transistor Na1 operate as current source and are set by the bias voltages Vb1 and Vb2 so that the source current Isource and the sink current Isink will be as approximately equal to each other as possible. The timing at which the source current Isource and the sink current Isink flow is adjusted depending on the ON-time of the transistors Pa2 and Na2 which are on/off controlled by the signals UPb and DN, respectively.

In case where the pulse width of the UP inversion signal UPb (complementary signal of UP) is equal with that of the down signal DN, and the relationship Isource=Isink holds, the control voltage Vcont (terminal voltage of the capacitor 21) is not changed.

In case where the pulse width of the inverted UP signal UPb is broader than that of the down signal DN, the control voltage Vcont rises, whereas, in case where the pulse width of the down signal DN is broader than that of the inverted UP signal UPb, the control voltage Vcont falls. The control voltage Vcont is supplied as a control signal to the voltage-controlled oscillator (VCO) 30. The higher the control voltage Vcont, supplied to the voltage-controlled oscillator 30, the higher is the frequency of the oscillating clock signal Vout.

When the input signal Vin is supplied, that is, responsive to the rising edge of Vin, the D-type flip-flop with reset 11 outputs the signal UP at a high level and the signal Upb at a low level, respectively.

When the feedback output signal Vout is supplied, that is, responsive to the rising edge of Vout, the D-type flip-flop with reset 12 outputs the signal DN at a high level and the signal DNb at a low level, respectively.

The AND circuit 13 outputs a signal reset, which is obtained by performing logical and operation between the signals UP and DN, to the delay adjustment circuit 14, which supplies Rup and Rdn to reset terminals of the D-type flip-flops 11 and 12, after controlled delay time, respectively. The D-type flip-flops 11 and 12, responsive to Rup and Rdn, reset the outputs UP and DN to a low level, and reset the output signals UPb and DNb to a high level.

Figure 4:
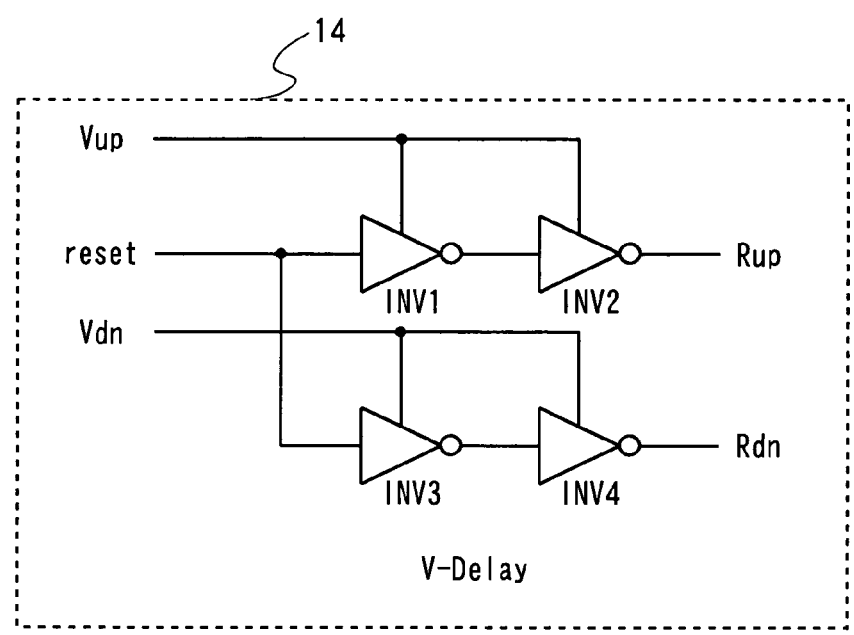
FIG. 4 is a diagram illustrating the configuration of a delay adjustment circuit of FIGS. 1 and 3.

The delay adjustment circuit 14 adjusts respective delay times from the input of the signal reset to the outputs of signals Rup and Rdn based on the input signals Vup and Vdn, separately. FIG. 4 is a diagram showing an example of the circuit configuration of the delay adjustment circuit 14 of FIG. 1. Referring to FIG. 4, the delay adjustment circuit includes a first delay line (composed by two-stage inverters INV1 and INV2), supplied with the reset signal reset to output Rup, and a second delay line (composed by two-stage inverters INV3 and INV4), supplied with the reset signal reset to output Rdn. The power supplies for the first and second delay lines are supplied by, for example, Vup and Vdn, respectively, so that independent delay control can be carried out. The delay time of the inverters may variably be controlled to a shorter time or to a longer time depending on the higher or lower power supply voltage, respectively. Alternatively, a current source transistor may be provided across the power supply and the power supply terminals of the inverters composing the delay line, and the bias voltage of the current source transistor may be supplied by Vup (Vdn), so that variable control of the delay time may be realized. It is noted that any suitable circuit configuration may be used as the configuration for the delay line, without limitation to the above-described configuration.

The signals Vup and Vdn, for controlling the delay of the respective reset signals Rup and Rdn in the delay adjustment circuit 14 of FIG. 1, are output from a comparator amplifier circuit (CMP) 40.

The comparator amplifier circuit (CMP) 40 compares a reference voltage Vref, output from a reference voltage generating circuit 60, comprised of a replica charge pump (RefG), with the output voltage Vcont of the charge pump circuit 20. When Vcont is higher than Vref, the voltage Vup is raised, and when Vcont is lower than Vref, the voltage of Vdn is raised. Should the voltage of the signal Vup be raised, the delay time of Rup from the delay adjustment circuit 14 is shortened. On the other hand, if the voltage of the signal Vdn is raised, the delay time of Rdn from the delay adjustment circuit 14 is shortened.

Figure 5:
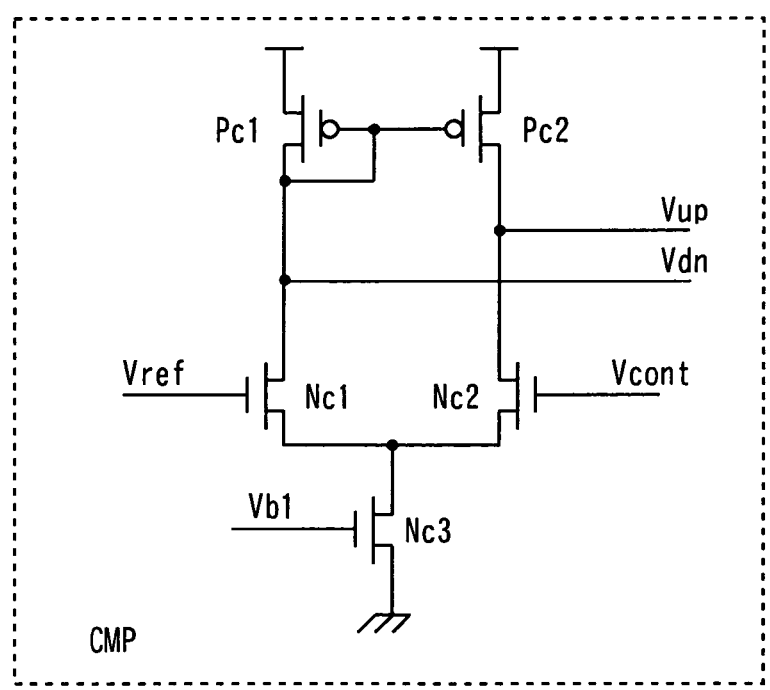
FIG. 5 is a diagram illustrating the configuration of a comparator amplifier circuit of FIG. 1.

FIG. 5 shows an illustrative circuit configuration of the comparator amplifier circuit (CMP) 40. Referring to FIG. 5, the comparator amplifier circuit includes transistors Nc1 and Nc2, constituting a differential pair, a transistor Nc3 constituting a current source for supplying the constant current to the differential pair, and transistors Pc1 and Pc2, constituting a current mirror. The transistors Nc1 and Nc2 have respective sources connected in common and have respective gates supplied with Vcont and a reference voltage Vref. The NMOS transistor Nc3 has a drain connected to the common sources of the differential pair transistors, has a gate supplied with Vb1 and has a source connected to GND. The current mirror circuit (Pc1, Pc2) constitutes an active load circuit of the differential pair. The PMOS transistor Pc1 has a source connected to a power supply, has a drain and a gate connected in common to the drain of the NMOS transistor Nc1. The PMOS transistor Pc2 has a source connected to a power supply, has a gate connected to the gate of the PMOS transistor Pc1 and has a drain connected to the drain of the NMOS transistor Nc2. The voltages Vdn and Vup are taken out from connection nodes between the differential pair and a load circuit, respectively. If Vref>Vcont, then Vup>Vdn, with the voltage Vup being raised, whereas, if Vref<Vcont, then Vup<Vdn, with the voltage Vdn being raised.

Referring to FIG. 1 again, a reference voltage generating circuit (RefG) 60 is configured similarly to the charge pump circuit 20. That is, the reference voltage generating circuit 60 includes PMOS transistors Pb1 and Pb2 and NMOS transistors Nb1 and Nb2. The PMOS transistor Pb1 has a source and a gate connected to the power supply VDD and to Vb2, respectively. The PMOS transistor Pb2 has a source connected to the drain of the PMOS transistor Pb1 and has a gate supplied with a voltage fixed at a low level. The NMOS transistor Nb2 has a drain connected to the drain of the PMOS transistor Pb2 and has a gate supplied with a voltage fixed at a high level. The NMOS transistor Nb1 has a drain connected to the source of the NMOS transistor Nb2, has a gate connected to Vb1, and has a source connected to ground. The reference voltage generating circuit (RefG) 60 generates an output voltage, when the same value of currents flows through the NMOS side and the PMOS side, by connecting the input UPb in the charge pump circuit 20 to the ground and by connecting the DN input to the power supply VDD, and outputs the so generated output potential as a reference voltage Vref.

Figure 7:
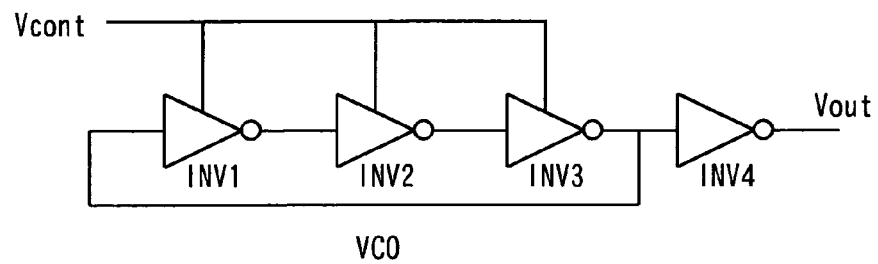
FIG. 7 is a diagram illustrating the configuration of a VCO of FIG. 1.

FIG. 7 is a diagram illustrating an example of the configuration of the VCO 30 of FIG. 1. The VCO is constituted by a ring oscillator in which an output of the last stage of an odd number of inverter stages, that is, 3rd stage inverter INV3, is connected in a feedback fashion to an input end of the initial stage inverter INV1, with the fourth stage inverter INV4 being used as an output stage. The control voltage Vcont is used as a power supply of the three stage ring oscillator (INV1-INV3) to control the oscillation frequency. The inverter delay time is variably controlled to a shorter time or a longer time depending on the higher or lower value of the power supply voltage, respectively. Alternatively, a current source transistor may be provided between the power supply and a power supply terminals of the inverters forming the ring oscillator, and the bias voltage of the current source transistor may be supplied by the control voltage Vcont, in order to variably control the delay time of the inverters.

Figure 8:
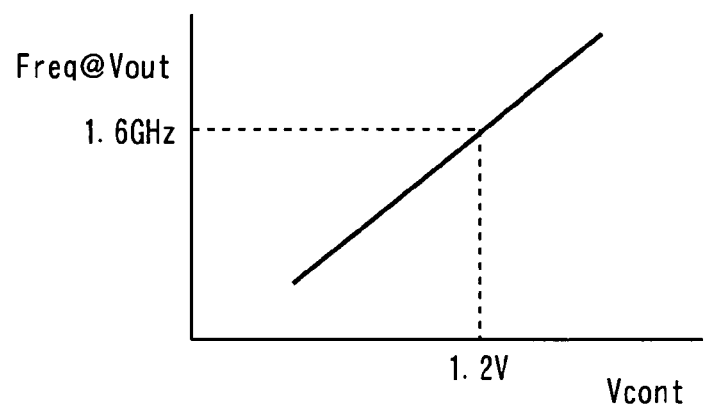
FIG. 8 is a graph showing voltage frequency characteristics of the VCO.

FIG. 8 shows the typical relationship between the control voltage Vcont in the VCO 30 and the output frequency. Referring to FIG. 8, the higher the value of the control voltage Vcont, the higher becomes the oscillation clock frequency. In the example of FIG. 8, the output frequency of 1.6 GHz is obtained for Vcont=1.2 V.

Referring to FIG. 9, the current offset of the charge pump circuit 20 will be described. Since the PMOS transistor Pa1 and the NMOS transistor Na1, which are current sources, making up the charge pump circuit 20, are MOS transistors, there is the relationship of VD (drain-to-source voltage) dependency on λ (channel length modulation coefficient), even in a saturation region, as indicated by the following equation (1):

$$ID = \tfrac{1}{2}(uCox)W/L \cdot (VG-Vth)^2 \cdot (1+\lambda VD) \qquad (1)$$

where ID, u, Cox, W, L, VG, Vth, λ and VD denote the drain current, effective mobility, capacitance of the gate oxide film, channel width, channel length, gate-to-source voltage, threshold voltage, channel length modulation coefficient and the drain-to-source voltage, respectively.

FIG. 9A shows an example of typical V-I characteristics between the control voltage Vcont and the source and sink currents Isource and Isink. The higher the voltage Vcont, the higher is the sink current Isink, and the lower becomes the source current. Conversely, the lower the voltage Vcont, the lower becomes the sink current Isink and the higher becomes the source current Isource. FIG. 9B shows a V-I characteristic between the control voltage Vcont and the current equal to Isource less Isink (Isource−Isink).

In an example shown in FIGS. 9A and 9B, Isource becomes equal to Isink when the power supply voltage is 1.8V and Vcont=0.9V. This output becomes the output voltage Vref of the reference voltage generating circuit 60 of FIG. 1. Thus, if Vin is 1.6 GHz, as an example, Vcont=1.2V is required in order that Vout also is equal to 1.6 GHz. With this voltage, the current value of the source current Isource is smaller than that of the sink current Isink. Hence, the operation is such that the difference will be absorbed by the pulse widths of the signals UP and DN indicating the results of the phase comparison. That is, for increasing the amount of charging by the source current Isource, it is necessary to increase slightly the pulse width of the up-pulse signal UP.

In the present embodiment, there is provided the delay adjustment circuit 14 in which the control voltage Vcont is compared with the reference voltage Vref and in which the delay is controlled by Vup and Vdn based on the results of comparison. The UP reset timing is delayed by the delay adjustment circuit 14 to adjust the pulse width to decrease the offset between the phase of the input signal Vin and that of an output feedback clock signal Vout.

Figure 10:
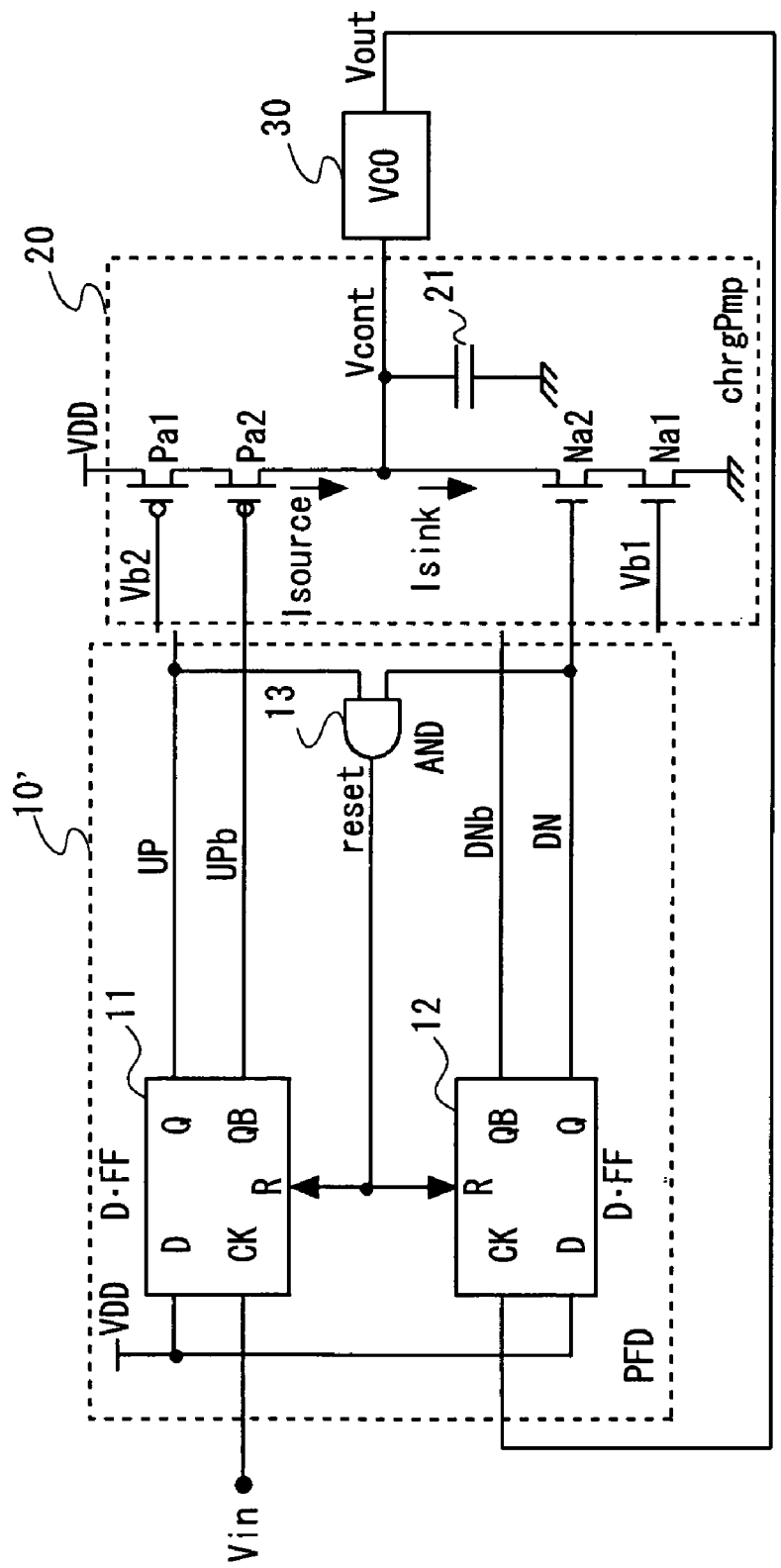
FIG. 10 is a diagram illustrating the configuration of a conventional PLL.
Figure 12:
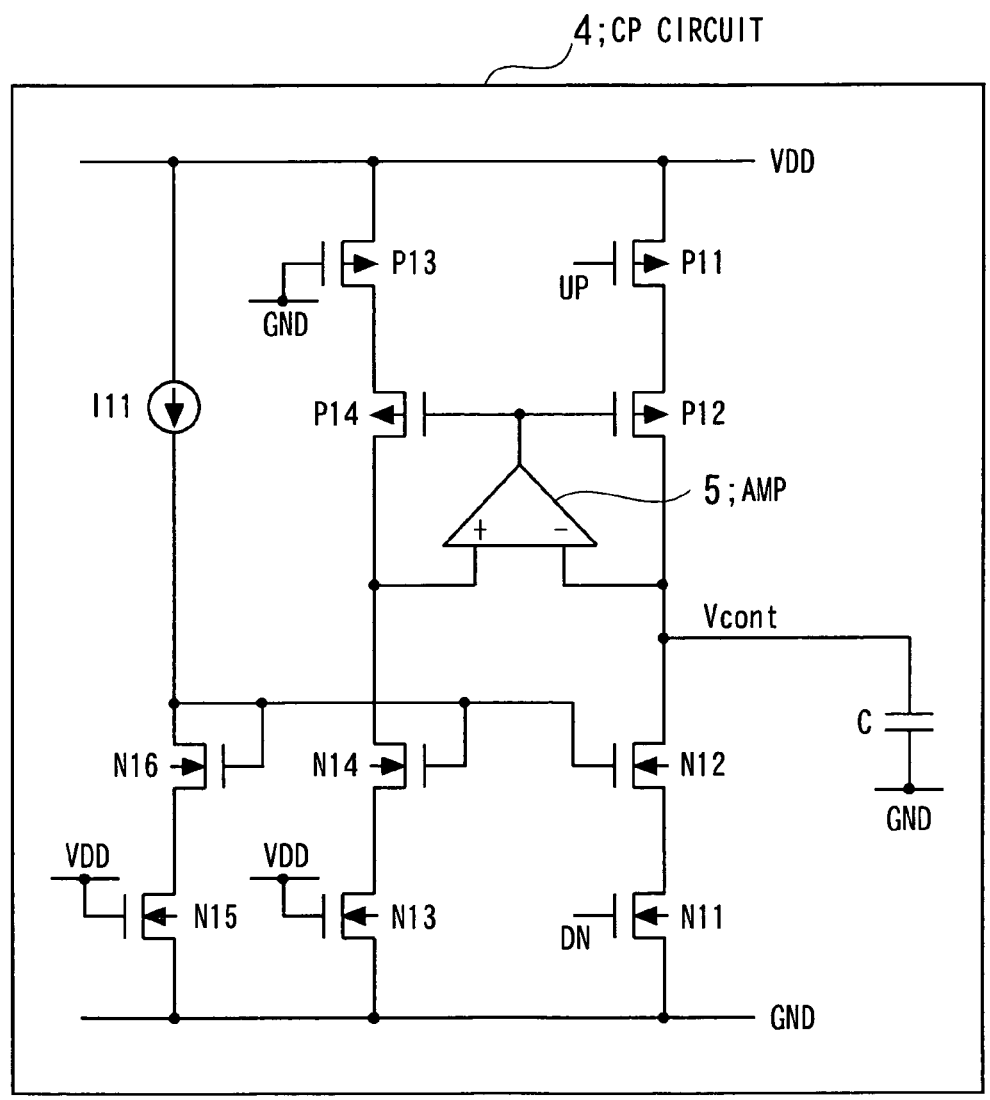
FIG. 12 is a diagram illustrating the configuration of a charge pump circuit of Patent Document 1.

If, as in the conventional PLL circuit, described with reference to FIG. 10, there lacks pulse width adjustment on the reset side (the side of the falling edge of UP and DN) by the delay adjustment circuit 14 of the present embodiment, the set side of UP, that is, at a time point where Vin is supplied at an earlier time, becomes a stable point. This turns out to be phase offset which is left over (see 'static offset' of FIG. 11B) and an operational error of the PLL circuit.

According to the present invention, described above, there is provided the means for adjusting the pulse width of the phase frequency detection circuit. The pulse width is adjusted, depending on an offset characteristic of the charge pump circuit, thereby reducing the phase offset produced by the charge pump circuit.

FIGS. 2A and 2B are timing diagrams illustrating typical operations of the PLL circuit according to the present embodiment. FIG. 2A is a timing diagram showing the operational before lock and FIG. 2B is a timing diagram showing the operational after the lock. By 'lock' is meant a stable state in which Vin and Vout exhibit frequency coincidence, with there being no phase change, as described previously. Although complete freeness from the phase difference is ideally desirable, there actually persists phase offset to a more or less extent.

FIG. 2A shows a state in which Vin and Vout are approximately coincident in frequency but are not completely in phase with each other and are still changing. Since Vin is operating slightly ahead of Vout, the pulse width of the set side of UP is broader. If only UP, the set side pulse width of which is broader, is high, the capacitor 21 is charged by the source current Isource and hence the control voltage Vcont is raised monotonously.

With both UP and DN both in the high level, charging and discharge are carried out by equal amounts of charge, by the source current Isource and by the sink current Isink, respectively, and hence the level of the control voltage Vcont is ideally unchanged. This state is shown by Vcont (ideal).

However, in actuality, the control voltage Vcont is close to 1.2V, so that the source current Isource is slightly smaller than the sink current Isink.

Thus, with both UP and DN in the high level, the control voltage Vcont is slightly lowered. This state is shown by Vcont (real).

In the present embodiment, the reset side timings of UP and DN are adjusted by the delay adjustment circuit 14, based on the level difference between the control voltage Vcont and the reference voltage Vref, so that DN and UP are reset earlier and later, respectively.

That is, the level of the control voltage Vcont, lowered with both UP and DN being high, is maintained to be equal to the level of the ideal operation Vcont (ideal), by charging the capacitor 21 which is with UP reset later.

FIG. 2B shows the state after the lock. Since the frequency is the same as described above, the voltage Vcont is at the level of 1.2V.

Since Vin and Vout are coincident with each other in both the phase and the frequency, the timing coincidence is obtained on the set sides of UP and DN (the side of the rising pulse edge).

With both UP and DN being high, the control voltage is lowered slightly. However, the timing is adjusted on the reset side (the side of the rising pulse edge) and the capacitor 21 is charged with UP which is reset later. Consequently, the voltage Vcont is kept in a state of an offset being kept small, such that its voltage level is retained.

The phase offset may be reduced in this manner by adjusting the reset timing of the output signal pulse of the phase frequency detector 10, depending on the current offset of the charging pump circuit 20.

By the way, though in FIG. 1, the output signal is directly fed to the input of the PFD 10, the present embodiment is not limited to this configuration. For example, the present embodiment shown in FIG. 1 may well be modified to such a configuration in which the output signal of the VCO 30 is supplied to a frequency-divider not shown which is provided between the VCO 30 and the PFD 10 and the frequency-divided version of the output signal from the VCO 30 is supplied as the feedback output signal to an input of PFD 10. The foregoing is applied to the following embodiment of the present invention described in the below.

Figure 3:
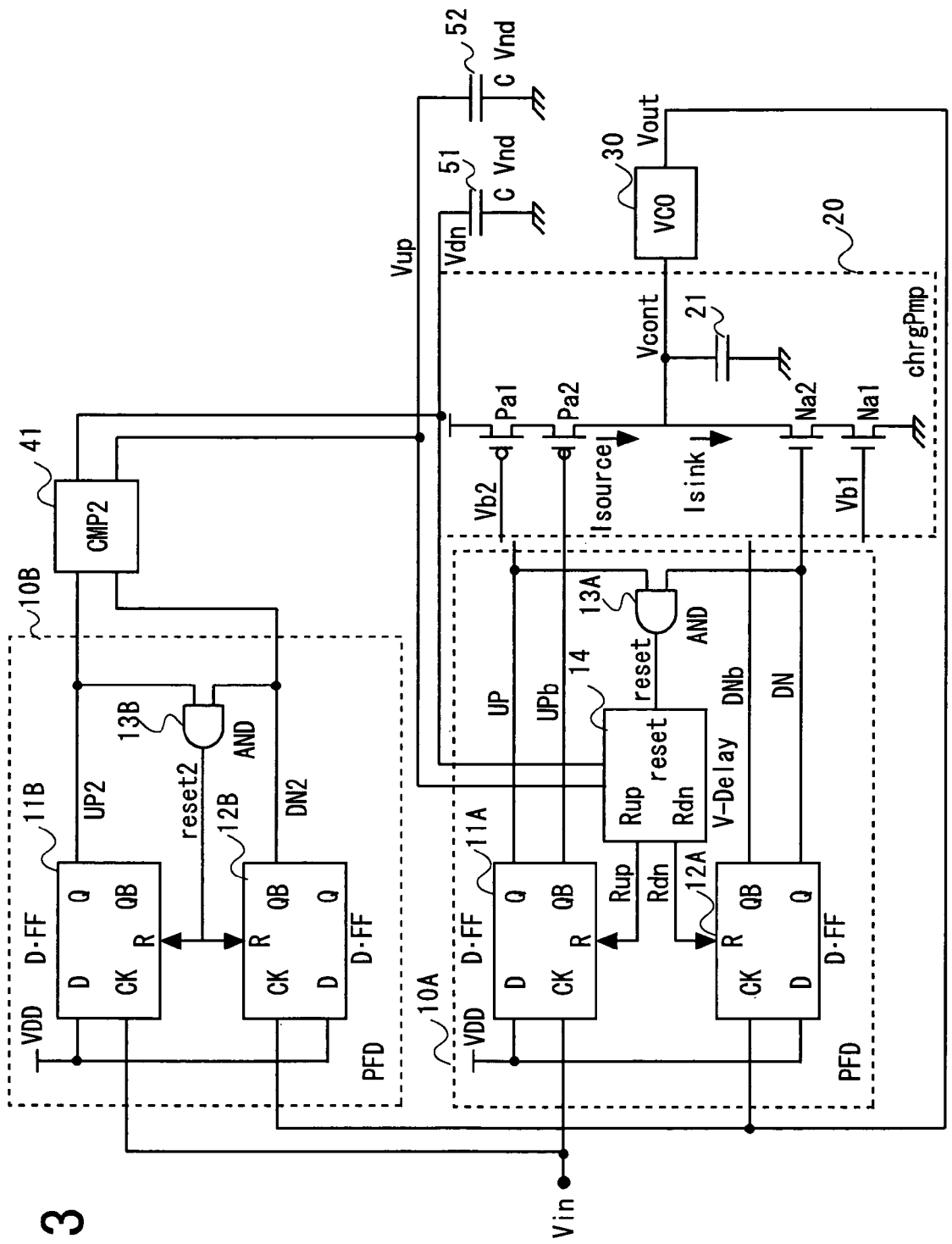
FIG. 3 is a diagram illustrating the configuration of a second embodiment of the present invention.

A second embodiment of the present invention will now be described. The second embodiment is configured for directly measuring the phase difference between VIN and VOUT, and has an advantage that it is scarcely affected by operating environments, such as manufacture tolerances, power supply voltage or operating temperature. FIG. 3 is a diagram illustrating the configuration of the second embodiment of the present invention. In FIG. 3, parts or components which are the same as or equivalent to those of the previous embodiment are depicted by the same reference numerals.

Referring to FIG. 3, PLL circuit according to the present embodiment differs from the first embodiment as to the configuration of a circuit for generating the signals Vup and Vdn used for controlling the delay of the delay adjustment circuit 14. A phase frequency detector (PFD) 10A, a charge pump circuit 20 and a VCO 30 are the same as in the first embodiment. In the present embodiment, there is provided a phase frequency detector 10B, while there is further provided, in place of the comparator amplifier circuit 40 of FIG. 1, a comparator amplifier circuit 41. The phase frequency detector 10B includes D-type flip-flops 11B and 12B, and an AND circuit 13B, without including a delay adjustment circuit, and is of the same configuration as the phase frequency detector 10' of FIG. 10, except that the phase frequency detector 10B outputs non-inverted outputs UP2 and DN2 (the phase frequency detector 10B does not output inverted output signals UP2b, or DN2b). The comparator amplifier circuit (CMP2) 41 compares the outputs UP2 with and DN2 to control the voltage of the output signals Vup and Vdn responsive to the pulse width. The phase frequency detector 10B is not provided with the delay adjustment circuit and hence the reset timing of UP2 is the same as that of DN2. It is noted that, if phase offset between Vin and Vout is present, UP2 and DN2 are of different pulse widths.

Figure 6:
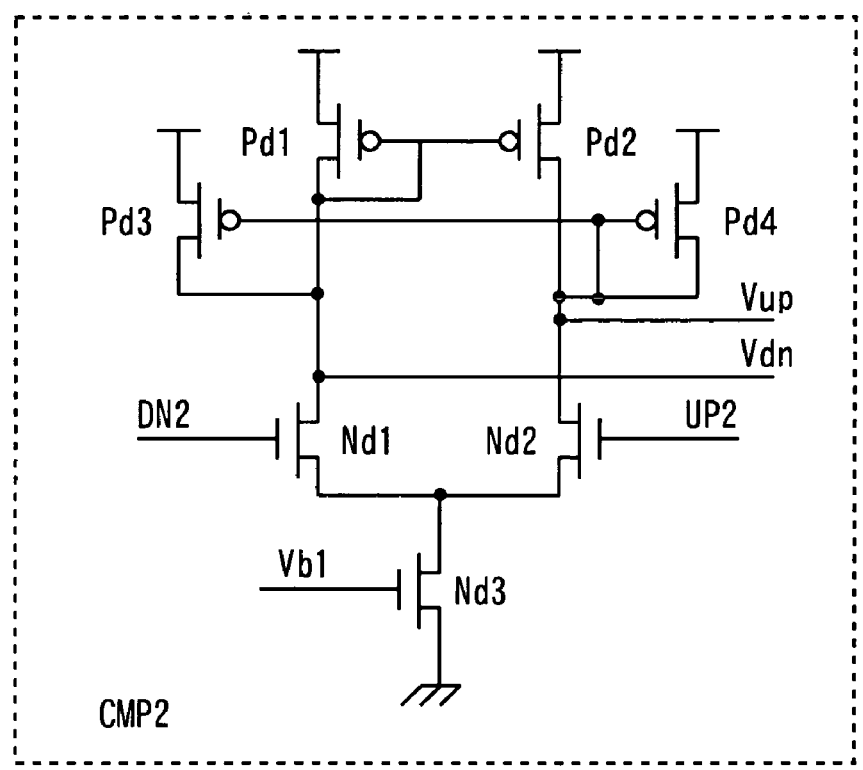
FIG. 6 is a diagram illustrating the configuration of a comparator amplifier circuit of FIG. 3.

The comparator amplifier circuit 41 is constructed as a differential integrating charge pump, that is, includes a differential comparator amplifier circuit and capacitors 51 and 52. The comparator amplifier circuit outputs the difference between pulse widths (phase difference) of DN and UP as the level difference between Vup and Vdn and holds the level difference even after the difference between pulse widths of DN and UP has been removed. FIG. 6 is a diagram showing the configuration of the comparator amplifier circuit (CMP2) 41. Referring to FIG. 6, the comparator amplifier circuit (CMP2) 41 includes, as a load circuit connected across the output pair of the differential pair (Nd1, Nd2) and the power supply, a first current mirror circuit (Pd1, Pd2) which has input and output connected to outputs (drains of transistors Nd1 and Nd2, respectively, and a second current mirror circuit (Pd3, Pd4), which has input and output connected to outputs (drains) f transistors Nd2 and Nd1, respectively. The voltages Vdn and Vup are taken out from connection nodes between the differential pair and the load circuit.

In the present embodiment, the phase difference between Vin ad Vout is integrated as the level difference between Vdn and Vup (capacitors 51 and 52) and fed back to the pulse width in the delay adjustment circuit 14 (timing of decay of UP and DN in resetting). Consequently, the signals Vup and Vdn for controlling the delay of the delay adjustment circuit 14 are held at a level at which the phase difference between Vin and Vout is eliminated.

The present embodiment is rather complex in circuit configuration than that of the previous embodiment, however, is appreciably improved in adjustment accuracy because the phase difference may directly be fed back to the pulse width.

Furthermore, the present embodiment directly measures the phase difference and hence is scarcely susceptible to adverse effects from an operational environment, that is, manufacture tolerances, power supply voltages or operating temperatures.

It should be noted that above-described configuration of the VCO, delay adjustment circuit, comparator amplifier circuit CMP or the comparator amplifier circuit CMP2 is merely illustrative and any suitable circuit may be used provided that the same functions may thereby be achieved. The embodiments described above may, of course, be extended to a phase detector (PD) for comparing two phases for outputting up and down signals to a charge pump circuit, without being limited to control of the pulse width of the phase frequency detector (PFD). Although the present invention has so far been described with reference to the above embodiments, the present invention is not to be limited to the configuration of the embodiments described and may naturally comprise various changes or corrections that may be feasible by those skilled in the art without departing from the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A device comprising:
a phase frequency detector that receives an input signal and a feedback output signal, that compares phase and frequency of the input signal with those of the feedback output signal and that outputs a comparison result output signal indicative of the result of comparison;
a charge pump circuit that receives the comparison result output signal from said phase frequency detector and that generates a control voltage in accordance with the result of comparison in said phase frequency detector;
a voltage-controlled oscillator that receives said control voltage and that generates an output signal of a frequency in accordance with said control voltage, said output signal of said voltage-controlled oscillator, or a frequency-divided version of said output signal, being supplied directly as said feedback output signal to said phase frequency detector; and
a circuit unit which produces at least one control signal relative to an offset characteristic of said charge pump circuit and supplies the at least one control signal to said phase frequency detector, the phase frequency detector responding to the at least one control signal to adjust a pulse width of the comparison result output signal in said phase frequency detector.

2. A device comprising:
a phase frequency detector that detects an input signal and a feedback output signal, that compares phase and frequency between the input signal and the feedback output signal and that outputs a comparison result output signal indicative of the result of comparison;
a charge pump circuit that receives the comparison result output signal from said phase frequency detector and that generates a control voltage in accordance with the result of comparison in said phase frequency detector; and
a voltage-controlled oscillator that receives said control voltage and that generates an output signal of a frequency in accordance with said control voltage, said output signal of said voltage-controlled oscillator, or a frequency-divided version of said output signal, being supplied as said feedback output signal to said phase frequency detector;
said phase frequency detector comprising:
a first flip-flop that receives said input signal and that outputs a first signal in an active state, responsive to transition of said input signal;
a second flip-flop that receives said feedback output signal and that outputs a second signal in an active state, responsive to transition of said feedback output signal;
a logic circuit that receives said first and second signals and that outputs an initial reset signal when said first and second signals are both in an active state;
a delay adjustment circuit that receives said initial reset signal output from said logic circuit and supplies first and second reset signals to reset terminals of said first and second flip-flops, respectively;
a reference voltage generating circuit for generating a voltage corresponding to the control voltage generated by said charge pump circuit when said first and second signals are both in an active state, and outputting the generated voltage as a reference voltage; and
a comparator amplifier circuit for comparing said control voltage output from said charge pump circuit with said reference voltage output from said reference voltage generating circuit, and generating first and second control signals which are for variably controlling the respective delays of said first and second reset signals in said delay adjustment circuit based on the result of comparison.

3. The device according to claim 2, wherein integrated values of said first and second control signals output from said comparator amplifier circuit are supplied to said delay adjustment circuit.

4. The device according to claim 2, wherein said charge pump circuit comprises:
a first switch and a first current source that supplies a source current, said first switch and said first current source being connected in series between a first power supply and a control voltage output terminal;
a second switch and a second current source that supplies a sink current, said second switch and said second current source being connected in series between a second power supply and said control voltage output terminal; and
a capacitor connected between said control voltage output terminal and said second power supply;
said first and second switches being controlled to be turned on when said first and second signals are activated.

5. The device according to claim 4,
said reference voltage generating circuit comprising:
a third switch and a third current source that supplies another source current, said third switch being set in an on-state, said third switch and said third current source being connected in series between said first power supply and a reference voltage output terminal;
a fourth switch and a fourth current source that supplies another sink current, said fourth switch being set in an on-state, said fourth switch and said fourth current source being connected in series between said second power supply and said reference voltage output terminal;

said reference voltage generating circuit outputting said reference voltage from said reference voltage output terminal.

6. The device according to claim 2, wherein said delay adjustment circuit comprises first and second variable delay circuits that receives in common from said logic circuit the initial reset signal and that delays the initial reset signal received by respective delay values specified by said first and second control signals supplied from said comparator amplifier circuit, to output said first and second reset signals.

7. The device according to claim 5, wherein the other source current equals the other sink current.

8. The device according to claim 2, wherein a capacitor is connected between said first control signal and ground and another capacitor is connected between said second control signal and ground.

9. The device according to claim 5, wherein a capacitor is connected between said first control signal and said second power supply and another capacitor connected between said second control signal and said second power supply.

10. A device comprising:

a first phase detector that receives an input signal and a feedback output signal, that compares phase of the input signal with that of the feedback output signal and that outputs a phase comparison result output signal indicative of the result of comparison;

a charge pump circuit that receives the phase comparison result output signal from said first phase detector and that generates a control voltage in accordance with the result of phase comparison in said first phase detector;

a voltage-controlled oscillator that receives the control voltage and that generates an output signal of a frequency in accordance with the control voltage, said output signal of said voltage-controlled oscillator, or a frequency-divided version of said output signal, being supplied as said feedback output signal to said first phase detector;

a circuit that generates a reference voltage corresponding to said control voltage when said phase comparison result output signal is activated and indicates that said input signal is in phase with said output signal; and a circuit that compares said reference voltage with said control voltage of said charge pump circuit and that generates a control signal based on said comparison result;

said first phase detector comprising a circuit that controls variably the delay time in resetting said phase comparison result output signal being in an active state to a non-activated state.

11. The device according to claim 10, wherein said first phase detector comprises a phase frequency detecting unit that detects the phase difference and the frequency difference between said input signal and said output signal.

* * * * *